US011326934B1

(12) United States Patent
Munger et al.

(10) Patent No.: US 11,326,934 B1
(45) Date of Patent: May 10, 2022

(54) WEIGHT SENSING APPARATUS WITH PIEZOELECTRIC TRANSDUCER

(71) Applicant: AMAZON TECHNOLOGIES, INC., Seattle, WA (US)

(72) Inventors: Paul Eugene Munger, Seattle, WA (US); Robert M. Riggs, Lynnwood, WA (US); Matthew Ray Desjardien, Kenmore, WA (US); Andrew James Pierce, Renton, WA (US); Jacob Drewniak, Seattle, WA (US); Kenneth Edward Doe, Carnation, WA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 82 days.

(21) Appl. No.: 16/864,763

(22) Filed: May 1, 2020

(51) Int. Cl.
*G01G 3/13* (2006.01)
*G01G 21/23* (2006.01)
*H01M 10/46* (2006.01)
*H02S 10/40* (2014.01)
*G06Q 10/08* (2012.01)

(52) U.S. Cl.
CPC .............. *G01G 21/23* (2013.01); *G01G 3/13* (2013.01); *H01M 10/465* (2013.01); *H02S 10/40* (2014.12); *G06Q 10/087* (2013.01)

(58) Field of Classification Search
CPC .......... G01G 3/13; G01G 3/14; G01G 3/1402; G01G 3/1404; G01G 3/1418; G01G 21/23; G01G 21/22; G01G 23/36; G06Q 10/087; H01M 10/465; H02S 10/40
See application file for complete search history.

(56) References Cited

U.S. PATENT DOCUMENTS

| 4,332,174 A | * | 6/1982 | Suzuki | G01G 3/1404 |
| | | | | 177/211 |
| 4,600,066 A | * | 7/1986 | Griffen | G01G 3/1412 |
| | | | | 177/211 |
| 4,909,340 A | * | 3/1990 | Kazais | G01G 3/147 |
| | | | | 177/211 |

(Continued)

OTHER PUBLICATIONS

Kleckers, Thomas, "Piezoelectric or Strain Gauge Based Force Transducers?", HBM, Inc., USA, 5 pages. Retrieved from the Internet: https://www.hbm.com/en/3719/piezoelectric-or-strain-gauge-based-force-transducers/.

(Continued)

*Primary Examiner* — Randy W Gibson
(74) *Attorney, Agent, or Firm* — Lindauer Law, PLLC

(57) ABSTRACT

An apparatus includes a platform or other accessory that is supported by one or more piezoelectric transducers. As items are placed on or removed from the accessory, the piezoelectric transducer generates an electric charge that is representative of a change in weight. An amplifier receives the charge and provides output voltage that can be sampled to determine a weight value. In one implementation the platform may be supported by a transducer assembly comprising a frame and a pair of piezoelectric transducers on opposite sides of the frame. Signals from the pair may be used to compensate for environmental effects on the assembly, such as changes in temperature. The piezoelectric transducers and associated circuitry are extremely energy efficient, consuming little electrical power during operation.

20 Claims, 6 Drawing Sheets

(56) References Cited

U.S. PATENT DOCUMENTS

| | | | | |
|---|---|---|---|---|
| 4,949,799 | A * | 8/1990 | Wernimont | G01G 3/1404 177/1 |
| 5,623,128 | A * | 4/1997 | Grimm | G01G 3/1406 177/211 |
| 5,671,362 | A * | 9/1997 | Cowe | G06Q 10/087 340/5.92 |
| 5,886,302 | A * | 3/1999 | Germanton | G01G 19/44 177/199 |
| 5,929,390 | A * | 7/1999 | Naito | G01L 1/2243 177/211 |
| 6,919,516 | B2 * | 7/2005 | Frye | G01G 3/1408 177/132 |
| 7,009,119 | B2 * | 3/2006 | Carlucci | G01G 19/44 177/199 |
| 9,939,309 | B2 * | 4/2018 | Carreel | G01G 3/1402 |
| 10,048,109 | B2 * | 8/2018 | Zhang | G01G 3/14 |
| 10,064,502 | B1 * | 9/2018 | Gyori | H04W 4/80 |
| 10,121,121 | B1 * | 11/2018 | De Bonet | A47B 57/34 |
| 10,466,095 | B1 * | 11/2019 | O'Neill | G01G 19/4144 |
| 10,614,415 | B1 * | 4/2020 | De Bonet | A47B 96/028 |
| 10,732,026 | B1 * | 8/2020 | Danenberg | G01G 21/00 |
| 10,746,589 | B1 * | 8/2020 | Danenberg | G01G 19/42 |
| 10,809,122 | B1 * | 10/2020 | Danenberg | G01G 21/23 |
| 10,969,267 | B1 * | 4/2021 | Franklin | G01G 19/18 |
| 11,017,350 | B1 * | 5/2021 | De Bonet | A47B 57/406 |
| 2003/0047603 | A1 * | 3/2003 | Lustenberger | G01G 19/42 235/385 |
| 2014/0201042 | A1 * | 7/2014 | Meyer | G06Q 10/087 705/28 |
| 2015/0160068 | A1 * | 6/2015 | Carreel | G01G 3/1404 177/1 |
| 2016/0048798 | A1 * | 2/2016 | Meyer | G01G 19/4144 705/28 |
| 2021/0196059 | A1 * | 7/2021 | Fritsch | A47F 10/02 |

OTHER PUBLICATIONS

"N-Channel Enhancement-Mode Vertical DMOS FET", Doc. # DSFP-TN0702, Supertex Inc., 2013, 5 pages. Retrieved from the Internet: URL: http://ww1.microchip.com/downloads/en/DeviceDoc/TN0702%20C080813.pdf.

"Force transducer: Piezoelectricity or strain gauge?", The Biomechanist, 2020, pp. 1-9.

* cited by examiner

WEIGHT SENSING APPARATUS WITH PIEZOELECTRIC TRANSDUCER

BACKGROUND

Weights sensors are used in many applications to determine weight on an accessory such as a platform, hook, bin, and so forth.

BRIEF DESCRIPTION OF FIGURES

The detailed description is set forth with reference to the accompanying figures. The use of the same reference numbers in different figures indicates similar or identical items or features. The figures are not necessarily drawn to scale, and in some figures, the proportions or other aspects may be exaggerated to facilitate comprehension of particular aspects.

Figure 1:
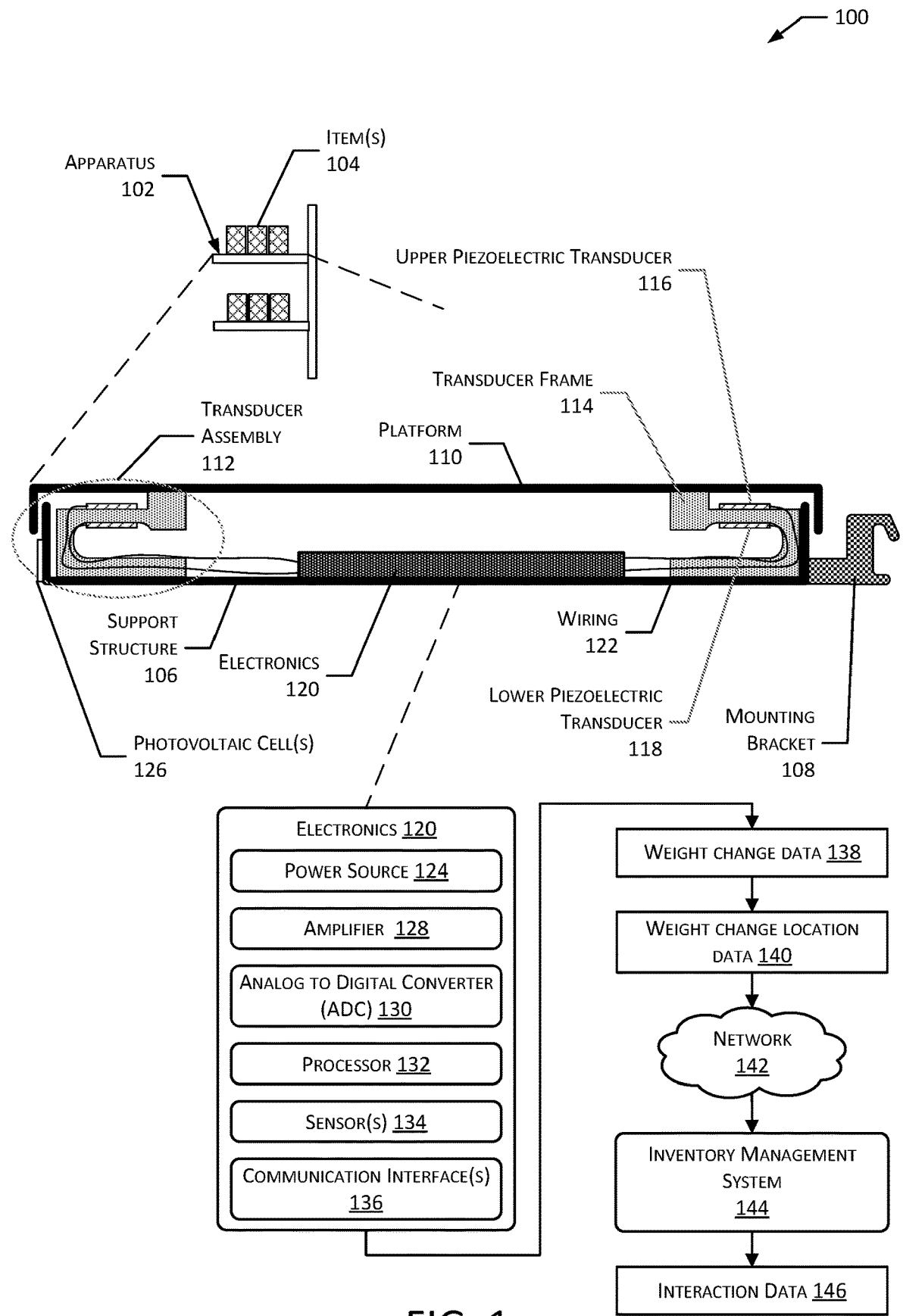
FIG. 1 illustrates a weight sensing apparatus with piezoelectric transducers, according to some implementations.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

A facility such as a home or business may utilize an apparatus to determine changes to inventory levels of one or more items that are on hand. The apparatus may include a platform or other accessory that is used to stow one or more items. Accessories may also include bins, hooks, racks, and so forth.

Users may perform interactions, such as removing or "picking" items from the platform or "placing" items onto the platform of the apparatus. These interactions result in a weight change on the platform. For example, a "pick" will result in a weight change on the platform by the weight of the item which was removed. In another example, a "place" will result in a weight change on the platform by the weight of the item that was put on the platform.

Information about a weight change from a first time to a second time may be used to determine whether an interaction is a pick or a place. In some implementations, if information about the weight of an item is known, a type of item or a quantity of items involved in the interaction may be determined. For example, if the weight change is measured at −300 grams, and individual items are known to weigh about 100 grams, a pick of 3 items may be determined.

In some implementations a weight change location may be determined that indicates where the change in weight took place, with respect to the platform or other accessory. The weight change location may be determined by using weight change values measured at multiple points with respect to the platform. In one implementation weight sensors may be located at each of the four corners of the platform. Weight change values from these four weight sensors may be used to determine, with respect to the two-dimensional plane of the platform, a weight change location that is indicative of where on the platform a change in center of mass took place. For example, an estimated location of where the item was picked from with respect to the platform may be determined. Based on the location, a type of item may be determined. For example, a left side of the platform may be assigned to store cans of corn while a right side is assigned to cans of peas. If the weight change location is determined to have occurred on the left side of the platform, the pick may be associated with a can of corn.

Weight changes to the platform or other accessory of the apparatus may be determined using one or more piezoelectric transducers. Each piezoelectric transducer comprises a piezoelectric material. A change in the mechanical stress on the piezoelectric material produces an electric charge. For example, if the piezoelectric material is squeezed, it will produce a charge with a first polarity. Likewise, if the piezoelectric material is stretched it will produce a charge with a second polarity. In one implementation the piezoelectric transducer may be affixed to a portion of a transducer frame. The transducer frame may be used to attach the platform to a support structure. As the load on the platform changes, the transducer frame changes shape, introducing a mechanical stress on the piezoelectric material, and producing a signal in the form of an electric charge. In another implementation, the piezoelectric transducers may be affixed to a portion of the platform or other accessory. As the weight supported by the accessory changes, the mechanical stress changes, producing a signal.

The signal from the piezoelectric transducer may be processed by electronic circuitry. The circuitry may include an amplifier comprising a pair of field effect transistors (FETs) that buffer the signal from the piezoelectric transducer. The output from the amplifier may then be processed by and analog to digital converter (ADC) and subsequently used by a processor. The process may determine a weight change value indicative of a change in weight associated with the apparatus. If the apparatus includes a plurality of piezoelectric transducers, a weight change location may also be determined that indicates where the weight change occurred with respect to the apparatus.

The use of a piezoelectric transducer provides significant benefits compared to other technologies such as a load cell using strain gauges. A piezoelectric transducer uses substantially less electrical power than a comparable load cell using strain gauges. For example, during testing a piezoelectric transducer consumed $1/40^{th}$ the electrical power of a comparable load cell using strain gauges.

The substantial decrease in power consumption allows for the weight sensor using a piezoelectric transducer to be deployed using a variety of different power sources and uses. The ability to use these different power sources allows for implementations in which the electronics of the apparatus may be self-contained and maintenance-free for years. For example, photovoltaic cells or primary cell batteries that are non-rechargeable may be used to power the circuitry of the apparatus removing the need for connecting to external power or maintenance involving changing batteries. A wireless communication interface may be used to send data such as the weight change value, weight location value, and so forth to another device.

Piezoelectric transducers may also be used to reduce the physical dimensions and overall size of the apparatus. For example, the piezoelectric transducers may be directly affixed to an underside of a platform, adding minimal thickness compared to a traditional load cell arrangement. As a result, the overall height of the apparatus may be reduced, freeing up volume for items to be stowed.

Piezoelectric transducers may cost less than comparable load cells, reducing the per unit cost of the apparatus. By reducing the per unit cost, the apparatus may be more widely adopted, facilitating deployment. In some implementations, instead of using a transducer assembly, the piezoelectric transducers may be applied to structures in the apparatus such as a platform, mounting bracket, and so forth. This use of an existing structure reduces the need for a separate transducer frame or other structure, reducing part count and simplifying assembly. The piezoelectric transducers may be applied via direct deposition, adhesive, lamination and so forth.

Using the apparatus described in this disclosure, it becomes feasible to affordably and easily implement large scale deployments of this kind of apparatus. For example, a materials handling facility such as a retail store or warehouse may have thousands of shelves. Using the apparatus described in this disclosure, those thousands of shelves may be replaced or supplemented with this apparatus, installed and operate for years without maintenance. Information such as weight change values and weight change locations may be provided to an inventory management system.

The facility may include, or have access to, the inventory management system. The inventory management system may use data from the apparatus such as weight change data, weight change location, and so forth to determine interactions in the facility.

Interactions may comprise the user picking an item from the apparatus, placing an item at the apparatus, moving an item, and so forth. For example, the inventory management system may generate interaction data that indicates what type and quantity of item a user picked from the apparatus or a particular part thereof, and then use this interaction data to adjust the count of inventory stowed at the particular apparatus, what type of item and quantity are in the possession of the user, and so forth.

Other sensors may be used in the facility as well. In some implementations, cameras may acquire image data of the interaction. The image data may be processed to determine if the user picked an item or placed an item, identity of the item involved, determine a quantity involved in the interaction, and so forth. The image data may be used in conjunction with weight data from the weight sensors of the apparatus to facilitate these determinations. For example, weight change data may indicate an event such as the user performing an interaction. Based on the weight change data, image data that corresponds to that time may be subsequently processed. One or more of the weight change data or the weight location data may also be used in conjunction with the image data to determine interaction data. For example, the weight change data and the image data may be used by the inventory management system to assess hypotheses regarding possible interactions and discard those hypotheses which are inconsistent with the observed weight data.

Illustrative System

FIG. 1 illustrates a system 100 with an apparatus 102 that can support items 104, according to some implementations. The apparatus 102 includes a support structure 106. For example, the support structure 106 may comprise a base housing that is attached or integral to, one or more mounting brackets 108. For example, the mounting brackets 108 may allow the apparatus 102 to be affixed to an upright support, such as a gondola rack. In other implementations, the mounting brackets 108 may be omitted, and the apparatus 102 may rest on another surface.

The apparatus 102 includes a platform 110. The one or more items 104 may rest on the platform 110. The platform 110 may support, or be replaced with, other structures to stow items 104, such as containers, bins, hangers, and so forth. In some implementations, instead of a platform 110 a crossbar or other structure may be used. The crossbar or other structure may include one or more containers, bins, hangers, or mechanical engagement features to allow attachment of containers, bins, hangers, and so forth.

The apparatus 102 may include one or more transducer assemblies 112. Each transducer assembly 112 may comprise a transducer frame 114. The transducer frame 114 attaches the platform 110 to the support structure 106. The transducer frame 114 may exhibit some mechanical deformation or change in shape when a mechanical load on the transducer frame 114 changes. The implementation of the transducer assembly 112 depicted in FIG. 1 is discussed in more detail with regard to FIG. 2. Affixed to the transducer frame 114 are one or more piezoelectric transducers.

Each piezoelectric transducer comprises a piezoelectric material. The piezoelectric material may comprise one or more of ceramics, organic material, and so forth. For example, the piezoelectric material may comprise lead zirconate titanate (PZT), sodium potassium niobite, polyvinylidene fluoride (PVDF), polyvinylidene chloride, (PVDC), and so forth. The piezoelectric material may be applied to a carrier material such as a plastic or metal film or may be applied directly to a structure. In some implementations the material comprising the structure may exhibit a piezoelectric effect and may be used as a piezoelectric transducer.

A change in the mechanical stress on the piezoelectric material produces an electric charge. For example, if the piezoelectric material is squeezed, it will produce a charge with a first polarity. Likewise, if the piezoelectric material is stretched it will produce a charge with a second polarity. Piezoelectric materials may be considered a dynamic material in that they will produce output when they experience some mechanical change. Once the change subsides, the output ceases. For example, if a weight is placed on a piezoelectric material at a first time, a first charge will be produced which then decays to zero over time. If the weight is removed at a second time, a second charge of opposite polarity will be produced which then decays to zero over time.

In the implementation shown in FIG. 1, an upper piezoelectric transducer 116 is affixed to an upper side of the transducer frame 114 and a lower piezoelectric transducer 118 is affixed to a lower or inner side of the transducer frame 114. The upper piezoelectric transducer 116 and the lower piezoelectric transducer 118 are thus arranged on opposite sides of the same portion of the transducer frame 114. As a result of this arrangement, as one transducer is stretched the other transducer is compressed. The output from the paired transducers may be used to compensate for changes in operation of the piezoelectric material due to changes in temperature, humidity, aging, and so forth. For example, the output from the upper piezoelectric transducer 116 may be summed with the output from the lower piezoelectric transducer 118. The resulting summed signal may be used to determine a weight change. In other implementations, other signal processing techniques may be used.

In the implementation depicted here, the platform 110 is supported by four transducer assemblies 112, each at a corner of the platform 110. Each transducer assembly 112 may comprise a pair of piezoelectric transducers on opposite sides of the same structure, such as shown here. The transducer assembly 112 is discussed in more detail with regard to FIG. 2. In other implementations, the transducer assembly 112 may comprise a single piezoelectric transducer.

The apparatus 102 includes electronics 120 connected by wiring 122 to the piezoelectric transducers. The wiring 122 may comprise flexible printed circuit, ribbon cable, coaxial cable, individual wires, and so forth. In some implementations one or more of the physical length or the electrical resistance of the wiring 122 between the electronics 120 and the transducers may be substantially the same. For example, the wiring 122 to each transducer may be the same length. This produces a substantially similar electrical resistance to the signals produced by the transducers as delivered to the electronics 120.

The electronics 120 may include a power source 124 that provides electrical power to the circuitry of the apparatus 102. The power source 124 may include one or more photovoltaic cells 126, thermocouples, capacitors, non-rechargeable primary cell batteries, and so forth. In some implementations the power source 124 may obtain electrical power from an external source. For example, power may be provided from an external power source such as building mains, power over Ethernet, wireless power transmission, and so forth.

The electronics 120 may include one or more amplifiers 128. One implementation of the amplifier 128 is discussed in more detail with regard to FIG. 6. The amplifiers 128 process the signal produced by the piezoelectric transducers and provide an output signal to one or more analog to digital converters (ADC) 130. In one implementation, each amplifier 128 may use a separate ADC 130. In other implementations, an ADC 130 may be multiplexed and process input from several amplifiers 128. The ADC 130 provides digital data that is representative of the output signal from the amplifier 128.

A processor 132 accepts the digital data produced by the ADC 130. The processor 132 may also accept input from one or more sensors 134, and use one or more communication interfaces 136. The processor 132 may comprise a microcontroller, microprocessor, field-programmable gate array, and so forth. The processor 132 may perform one or more operations described herein.

The apparatus 102 may include one or more additional sensors 134. An inertial measurement unit (IMU) 134(1) may include one or more accelerometers or gyroscopes. The IMU 134(1) may generate movement data indicative of linear movement or rotation. The movement data may be used by the processor 132 to determine if the apparatus 102 has been moved, presence of vibration at a given time, and so forth. For example, the movement data may be used to determine whether vibration of the apparatus 102 exceeds a vibration threshold. In response to this determination, the processor 132 may suspend operation of one or more components until the vibration decreases below the vibration threshold.

The apparatus 102 may include a temperature sensor 134(2) to generate temperature data. The temperature data may be used to compensate for temperature change effects on the apparatus 102. For example, the charge output from the piezoelectric material may vary based on temperature. The temperature data may be used to apply a correction factor to improve the accuracy of the data produced by the apparatus 102.

The apparatus 102 may include a radio frequency identification (RFID) reader 134(3), near field communication (NFC) systems, and so forth, to read data from tags on the items 104, in the surrounding environment, and so forth. For example, the RFID reader 134(3) may be used to determine the type of item 104 that is present on the platform 110, to determine if more than one type of item 104 is present on the platform 110, and so forth. In another example, the RFID reader 134(3) may be used to interrogate and read a tag associated with a piece of furniture, and so forth. For example, the RFID 134(3) may read a tag that designates a particular location within the facility, such as "break room 3" or "kitchen pantry". This information may be used to facilitate operation of the system, such as by specifying where a replenishment order is to be delivered to facilitate restock.

The apparatus 102 may include one or more communication interfaces 136. The communication interfaces 136 enable the apparatus 102, or components thereof, to communicate with other devices or components. For example, an output line of the processor 132 may be connected to the communication interface 136. The communication interfaces 136 may include one or more I/O interfaces. The I/O interfaces may comprise Inter-Integrated Circuit (I2C), Serial Peripheral Interface bus (SPI), Universal Serial Bus (USB) as promulgated by the USB Implementers Forum, RS-232, and so forth.

The communication interfaces 136 may include one or more network interfaces. The network interfaces may include devices configured to couple to personal area networks (PANs), local area networks (LANs), wireless local area networks (WLANS), wide area networks (WANs), and so forth. For example, the network interfaces may include devices compatible with Ethernet, Wi-Fi, Bluetooth, Bluetooth Low Energy (BLC), ZigBee, LTE, 5G, and so forth. The communication interface 136 may comprise a wireless communication interface that uses one or more of a radio transmitter, acoustic transmitter, optical transmitter, and so forth to send information to another device. For example, the wireless communication interface 136 may use an infrared transceiver to send and receive data.

During operation, the electronics 120 may determine one or more of weight change data 138 or weight change location data 140. The weight change data 138 is indicative of a weight change of a load supported by the platform 110 or other accessory, as measured by the piezoelectric transducers. The weight change data 138 may include data indicative of whether a weight change was positive (weight added to platform 110) or negative (weight removed from the platform 110). The weight change data 138 may be provided for each individual piezoelectric transducer, transducer assembly 112, aggregated together, and so forth. For example, the weight change data 138 may indicate the weight change with respect to each of the four transducer assemblies 112, one of which is at each corner in this implementation. In another example, the weight change data 138 may indicate a total weight change.

In one implementation, the electronics 120 may use the digital data produced by the ADC 130 that is representative of a voltage of the output from the amplifier 128. The value of the digital data may be used in conjunction with a lookup table (LUT) to determine a weight in kilograms that is associated with the voltage. In other implementations, other techniques may be used.

The electronics 120 may determine weight change location data 140 that indicates where the change in weight took place, with respect to the platform or other accessory. The weight change location data 140 may be determined by using weight change data 138 obtained from piezoelectric transducers at two or more points with respect to the platform 110 or other structure such as a crossbar. The weight change location data 140 may be indicative of coordinates with respect to one or more axes associated with the platform 110.

In the implementation described with respect to FIG. 1, transducer assemblies 112 are located at each of the four corners of the platform 110. Weight change values from these four transducer assemblies 112 may be used to determine where, with respect to the two-dimensional plane of the platform 110, a weight change took place. With this implementation, the weight change location data 140 may represent coordinates with respect to an X axis that is parallel to a front edge of the platform 110 (e.g. left to right) and a perpendicular Y axis (e.g. front to back).

In some implementations, the apparatus 102 may be divided into one or more lanes or other partitioned areas. Each lane is an area upon the platform 110 that may be associated with a particular type of item 104. For example, a first lane may stow canned peas, a second lane may stow canned corn, a third lane may be used to stow canned lettuce, and so forth. As described below, by using the weight change location data 140, the location of the lanes with respect to the apparatus 102, and information about which types of items 104 are designated as being stowed in particular lanes, the type of item 104 picked or placed may be determined.

The electronics 120 may provide other functions, such as event detection, signal filtering, and so forth. The output from a piezoelectric transducer may be sampled by the ADC 130 at a rate of 200 Hz with 12 bits per sample. The resulting 12 bit data may be conditioned using a third-order infinite impulse response (IIR) Chebyshev lowpass filter with a 10 Hz bandwidth. The processor 132 may use a cumulative sum (CUSUM) algorithm to determine a weight change is taking place in the conditioned data. Once a weight change is determined to have taken place, one or more of the weight change data 138 or the weight change location data 140 may be generated and sent. In some implementations, after the change is detected, the net change on a piezoelectric transducer may be calculated by subtracting the average after the change from the average before the change. A bias resulting from a feedback resistor in a charge amplifier may result in a decay in the signal to zero. This bias may be removed using a compensating filter.

The compensating filter addresses biases that may be introduced as a result of operation of the piezoelectric transducers. In the following "z" is representative of a signal produced by a piezoelectric transducer. Time is indicated by "t", and the moment at which a change in weight takes place is "t0". In one implementation, a first compensating filter may use an estimate of a time constant "T" and an estimate of a final value "z0" for the piezoelectric transducer, and apply an IIR filter R that reconstructs the weight change given z. This first compensating filter may be considered an inverse of a transfer function from w to z, and behaves as an integrator. Over time, t and z0 may drift, in which case the parameters of the filter may be tuned to compensate.

In another implementation, a second compensating filter may be employed that uses two linear regression models. A first linear regression model "La" is fitted to a portion of z within a first interval before t0. A second linear regression model "Lb" is fitted to a portion of z within a second interval after t0. The first interval and second interval are relatively short compared to T. As a result, a substantial portion of the exponential decay in z is absorbed by La and Lb. The estimated weight change is then La(t0)−Lb(t0). No model is presumed for z, and thus performance is improved compared to the use of the integrator.

The processor 132 may receive the data representative of the signal z produced by the piezoelectric transducer from the ADC 130. A change in the signal may be determined to occur at a first time. For example, a CUSUM algorithm may determine a change occurred at the first time. In another example, the change determined by the first signal may have exceeded a threshold value at the first time.

A first interval is determined that begins at a second time and ends at the first time. A second interval is determined that begins at the first time and ends at a third time. A first fit of a first linear regression model (La) to the portion of the first signal that is within the first interval is determined. A second fit of a second linear regression model to the portion of the first signal that is within the second interval is determined. The weight change data 138 may then be determined based on a difference between the first fit and the second fit.

In some implementations, a feedback resistor within the amplifier 128 may be used to reduce or eliminate the use of a compensating filter.

The apparatus 102 may use the communication interface 136 to connect to one or more networks 142. The apparatus 102 may use the network 142 to send information such as one or more of the weight change data 138, the weight change location data 140, and so forth to another system, such as an inventory management system 144. Other information such as a device identifier, media access control address, temperature data, battery status, apparatus status, and so forth may also be sent.

The electronics 120 described herein, in particular the use of the piezoelectric transducers, provide significant benefits compared to other technologies such as a load cell using strain gauges. For example, during testing, during operation the piezoelectric transducer consumed $\frac{1}{40}^{th}$ the electrical power of a comparable load cell using strain gauges.

The substantial decrease in power consumption allows the apparatus 102 to be deployed using a variety of different power sources 124 and uses. For example, the low power consumption allows for operation using power obtained from photovoltaic cells 126 or from a non-rechargeable battery. This results in an apparatus that is self-contained and maintenance-free for years. No external power needs to be provided, which substantially reduces installation and operating costs. No batteries need to be changed for long periods of time, removing the labor and expense in changing batteries.

The piezoelectric transducers may also be used to reduce the physical dimensions and overall size of the apparatus 102. For example, the piezoelectric transducers may be directly affixed to an underside of a platform 110 as described with respect to FIGS. 4 and 5, adding minimal thickness compared to a traditional load cell arrangement. As a result, the overall height of the apparatus 102 may be reduced. This reduction in height frees up volume for items 104 to be stowed in the facility.

The use of piezoelectric transducers may cost less than comparable load cells, reducing the per unit cost of the apparatus 102. By reducing the per unit cost, the apparatus 102 may be more widely adopted, facilitating deployment. Further cost reductions may be realized in some implementations. For example, instead of using a transducer assembly 112, the piezoelectric transducers may be applied to structures in the apparatus 102 such as a platform 110, mounting bracket 108, and so forth. This use of an existing structure reduces the need for a separate transducer frame 114 or other structure, reducing part count and simplifying assembly. The piezoelectric transducers may be applied via direct deposition, adhesive, lamination and so forth.

Using the apparatus 102 described in this disclosure, it becomes feasible to affordably and easily implement large scale deployments of this kind of apparatus 102. For example, a materials handling facility such as a retail store or warehouse may have thousands of shelves. By using the apparatus 102, those thousands of shelves may be replaced or supplemented with apparatuses 102 that are easily installed and operate for years without maintenance. Information such as weight change values and weight change locations may be provided to an inventory management system 144.

The inventory management system 144 may be configured to perform various functions. The inventory management system 144 may maintain and utilize item data and physical layout data. The item data comprises information about a particular type of item 104. The item data may include information indicative of a weight of a single item 104, or a package, kit, or another grouping considered to be a single item 104. The item data may include other characteristics of that type of item 104 such as: physical dimensions, characteristics about how the item 104 appears, and so forth. For example, the item data may comprise a plurality of local descriptor values generated by feature extraction algorithms, parameters for classifiers, neural network configuration data, and so forth, that characterizes the appearance of a representative one or more of the item 104.

The item data may indicate the types and quantities of items 104 that are expected to be stored at a particular apparatus 102 or a particular location on the platform 110 of an apparatus 102. The item data may include weight distribution data of the item 104.

The physical layout data may provide information indicative of where apparatus 102 are located in the facility, location of sensors, information about sensor orientation and field of view (where applicable), and so forth. For example, the physical layout data may comprise information representative of a map or floor plan of the facility with relative positions of apparatus 102, planogram data indicative of how types of items 104 are to be arranged at the apparatus 102, and so forth.

The inventory management system 144 may access one or more of the weight change data 138, the weight change location data 140, the item data, the physical layout data, or other data to generate interaction data 146. The facility may include other sensors, such as cameras having a field of view that includes at least a portion of the apparatus 102 or another fixture. The sensors generate sensor data, such as image data from the camera. The interaction data 146 provides information about an interaction, such as a pick of an item 104 from the apparatus 102, a place of an item 104 to the apparatus 102, a touch made to an item 104 at the apparatus 102, a gesture associated with an item 104 at the apparatus 102, and so forth. The interaction data 146 may include one or more of the type of interaction, interaction location identifier indicative of the apparatus 102 at which the interaction took place, an item identifier indicative of a type of item 104 or a particular item 104, quantity change to the item 104, user identifier, and so forth. The interaction data 146 may then be used to further update the item data. For example, the quantity of items 104 on hand at a portion of the platform 110 on the apparatus 102 may be changed based on an interaction that picks or places one or more items 104.

Figure 2:
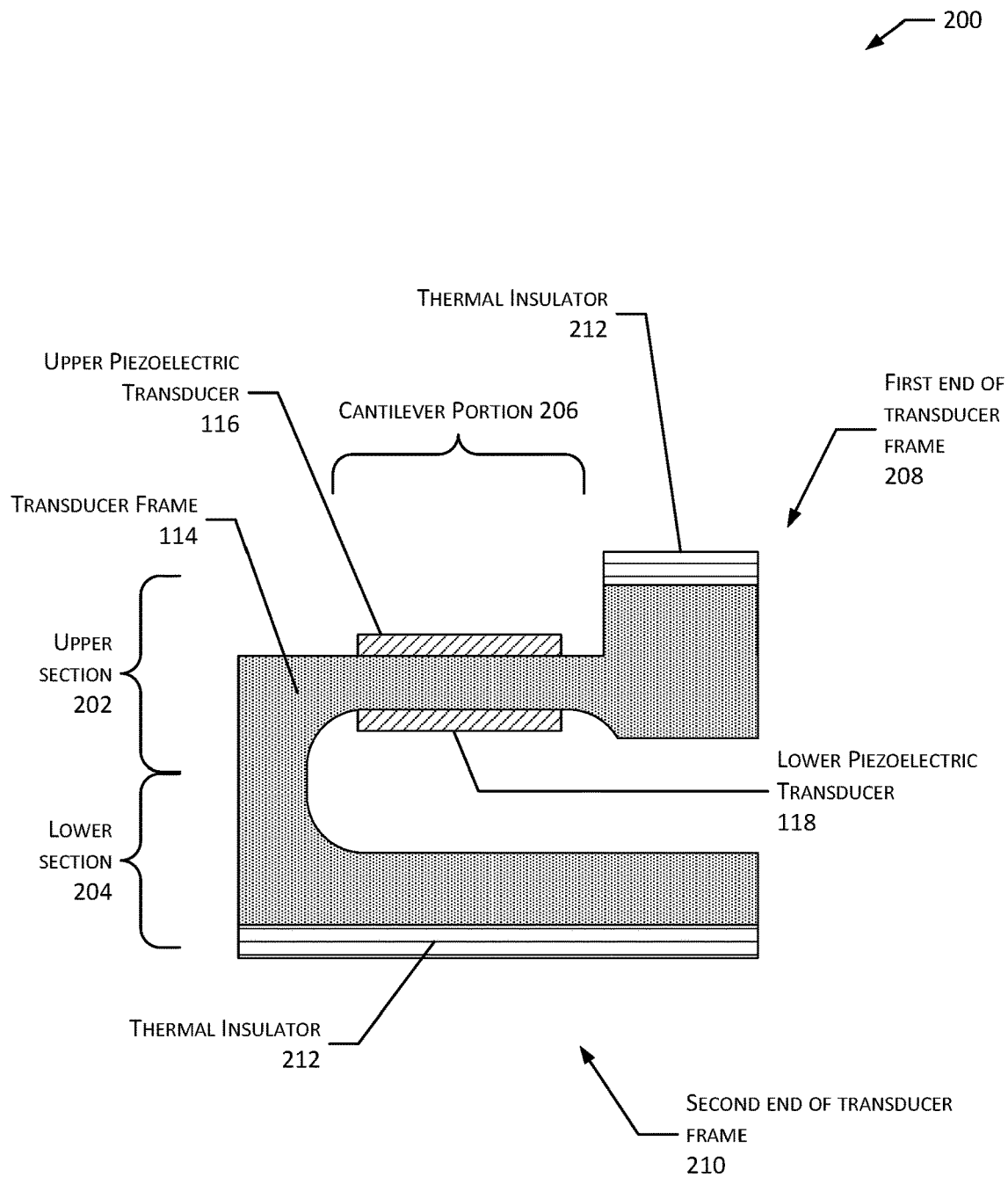
FIG. 2 illustrates a side view of a first type of transducer assembly, according to some implementations.

FIG. 2 illustrates a side view 200 of a first type of transducer assembly 112, according to some implementations. In this implementation, the transducer assembly 112 comprises a transducer frame 114 having an upper section 202 and a lower section 204. The overall profile of the transducer frame 114 resembling a "C". A cantilever portion 206 extends horizontally and has an upper surface and a lower surface. The cantilever portion 206 is approximately parallel to a portion of the lower section 204. In this implementation, an upper piezoelectric transducer 116 is affixed to the upper surface and a lower piezoelectric transducer 118 is affixed to the lower surface. In some implementations a single piezoelectric transducer may be used. In another implementation the piezoelectric transducers may be applied to one or more of an outer surface or an inner surface of a vertical portion of the transducer frame 114 that joins the upper section 204 to the lower section 204.

The transducer frame 114 includes a first end 208 and a second end 210. The transducer frame 114 may be attached at the ends to other structures. For example, the first end 208 may be attached to the platform 110 while the second end 210 is attached to the support structure 106.

In some implementations one or more thermal insulators 212 may be installed between the transducer frame 114 and another structure. For example, a first thermal insulator 212 is shown atop the first end 208 of the transducer frame and a second thermal insulator 212 is shown below the second end 208. The thermal insulator 212 may comprise a plastic, ceramic, and so forth. In some situations, changes in temperature may affect operation of the piezoelectric transducers. By utilizing one or more thermal insulators 212 to reduce heat transfer between structures such as the transducer frame 114 and the platform 110 or the transducer frame 114 and the support structure 106, overall performance of the system may be improved. For example, the thermal insulator 212 mounted between the first end 208 of the transducer frame 114 and the platform 110 will reduce the effects, especially in relatively short time scales, of placing a cold metal object on a metal platform 110. Continuing the example, the thermal insulator 212 impairs the cooling of the transducer frame 114 and the upper piezoelectric transducer 116 and lower piezoelectric transducer 118 affixed thereto. Such a relatively sudden temperature change could result in the piezoelectric material producing a signal responsive to the change in temperature rather than a change in weight on the platform 110.

In other implementations the transducer frame 114 may comprise a thermally resistive material, such as a plastic, ceramic, composite material, and so forth.

Figure 3:
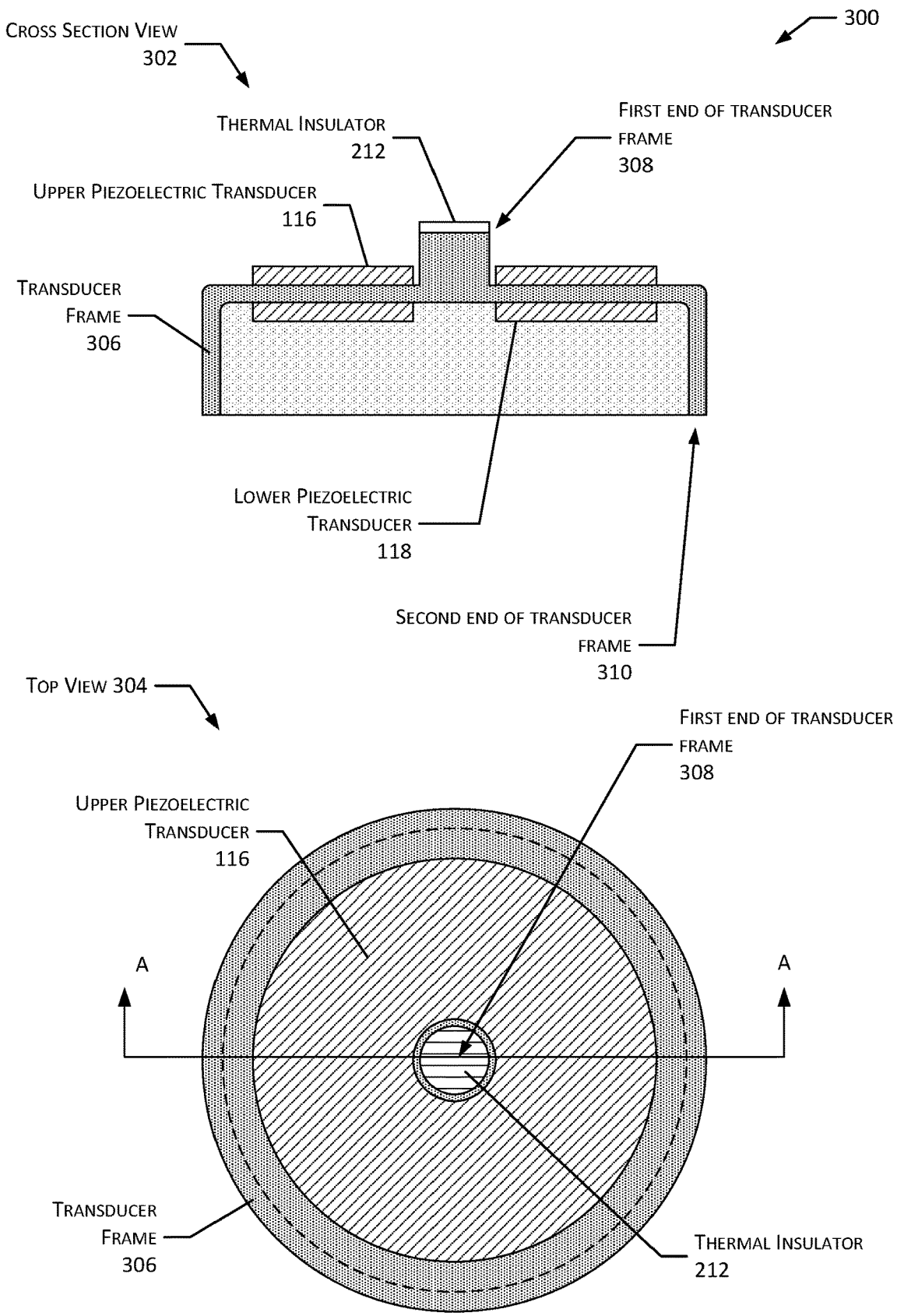
FIG. 3 illustrates views of a second type of transducer assembly, according to some implementations.

FIG. 3 illustrates views 300 of a second type of transducer assembly 112, according to some implementations. Shown are a cross section view 302 and a top view 304 of this implementation of transducer assembly 112. A transducer frame 306 in this implementation is cylindrical with respect to a vertical axis, along which a load such as the platform 110 may be supported, as shown in the top view 304. The cross section view 302 along line A-A shows the transducer frame 306 having a profile resembling an inverted "U", with the opening on the underside.

The transducer frame 306 has a first end 308 and a second end 310. The first end 308 may comprise a post or other feature that extends from a body of the transducer frame 306. As described with regard to FIG. 2, one or more thermal insulators 212 may be used in some implementations. In other implementations the transducer frame 306 may comprise a thermally resistive material, such as a plastic, ceramic, composite material, and so forth.

The transducer frame 306 may be attached at the ends to other structures. For example, the first end 308 may be attached to the platform 110 while the second end 310 is attached to the support structure 106.

In this implementation, the upper piezoelectric transducer 116 and the lower piezoelectric transducer 118 may each comprise a ring of piezoelectric material affixed to the upper surface and lower surface, respectively, of the transducer frame 306. In other implementations, a single piezoelectric transducer may be used. For example, the lower piezoelectric transducer 118 may comprise a disc.

Figure 4:
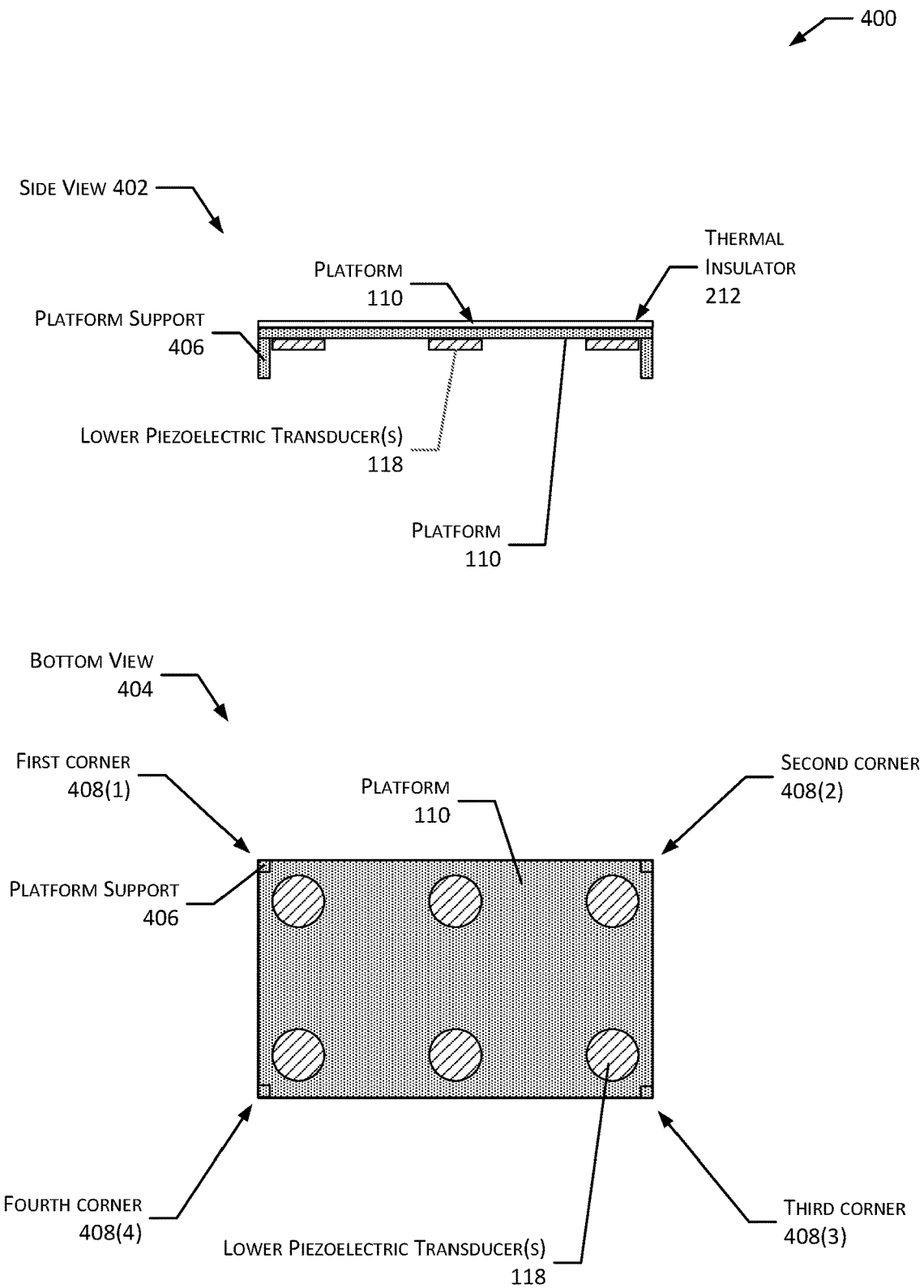
FIG. 4 illustrates views of another implementation of a weight sensing apparatus with piezoelectric transducers, according to some implementations.

FIG. 4 illustrates views 400 of another implementation of a weight sensing apparatus 102 with piezoelectric transducers, according to some implementations. A side view 402 and a bottom view 404 are shown. The platform 110 is supported by a plurality of platform supports 406. For example, a platform support 406 proximate to each corner of the platform 110 may be affixed to the support structure 106 (not depicted here).

In some implementations a thermal insulator 212 may be installed atop the platform 110. For example, a layer of plastic may cover the platform 110. In some implementations the platform 110 may comprise a thermally resistive material, such as plastic, ceramic, and so forth.

A plurality of lower piezoelectric transducers 118 are affixed to the underside of the platform 110. One arrangement of the lower piezoelectric transducers 118 is depicted in the bottom view 404, showing an array of disc-shaped piezoelectric transducers. The platform 110 has four corners 408(1)-408(4). A lower piezoelectric transducer 118 is mounted proximate to each corner. Two additional lower piezoelectric transducers 118 are arranged along a centerline of the platform 110.

Other arrangements and other shapes of piezoelectric transducers may also be used. For example, the shape of the transducers may be rectangular, other patterns with respect to the platform 110 may be used, and so forth. In some implementations upper piezoelectric transducers 116 may also be used, mounted on the upper surface of the platform 110.

By providing for an array of piezoelectric transducers, the electronics 120 may provide weight change location data 140 with improved accuracy. By analyzing the signals from the piezoelectric transducers, the weight change location may be determined. The use of a plurality of piezoelectric transducers may allow for the determination of complex interactions, such as a simultaneous or near-simultaneous pick of one item 104 from a first lane on the platform 110 and a place of another item 104 from a second lane on the same platform 110.

Figure 5:
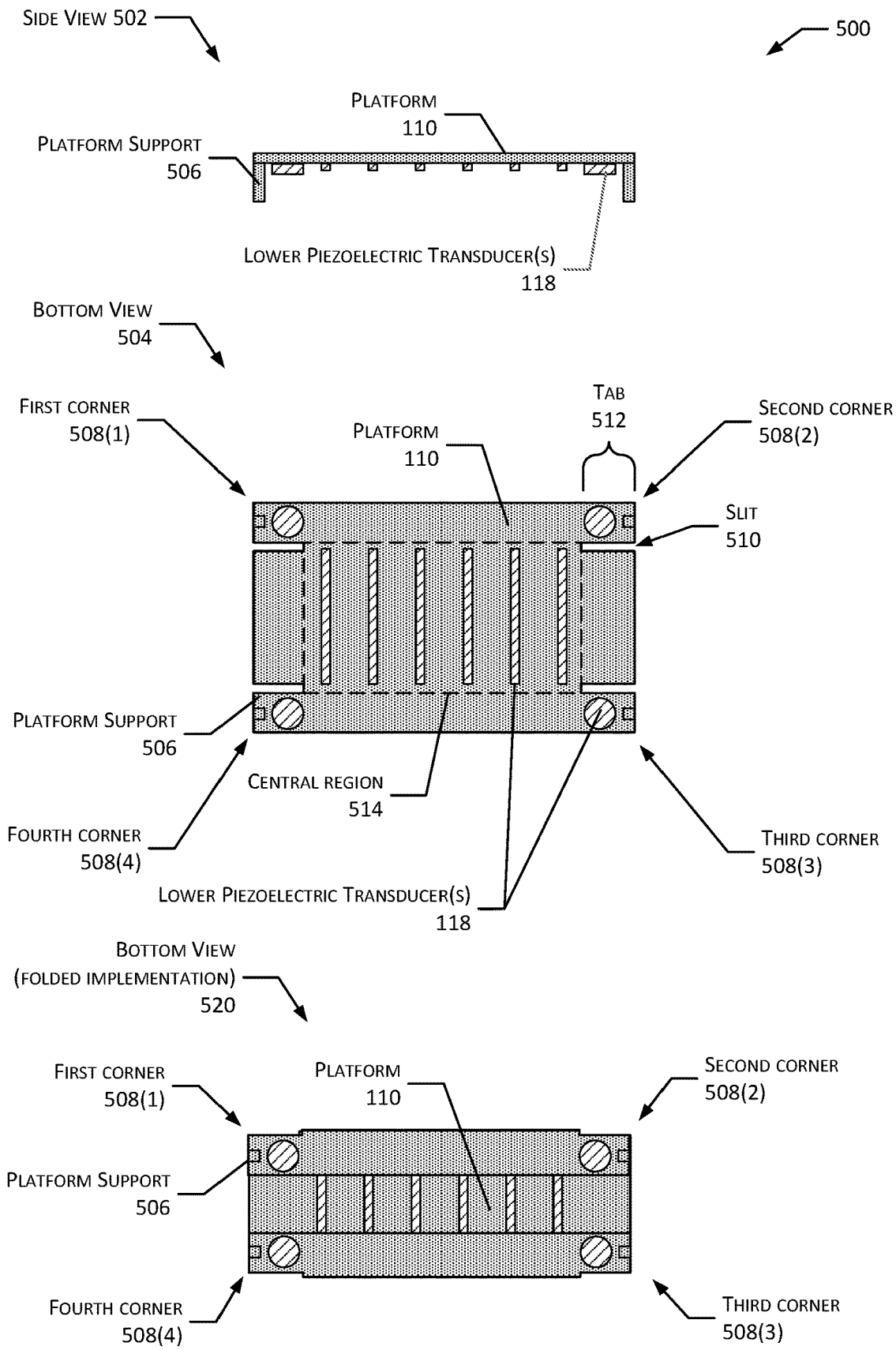
FIG. 5 illustrates views of another implementation of a weight sensing apparatus with piezoelectric transducers, according to some implementations.

FIG. 5 illustrates views 500 of another implementation of a weight sensing apparatus 102 with piezoelectric transducers, according to some implementations. A side view 502 and a bottom view 504 are shown. The platform 110 is supported by a plurality of platform supports 506. The platform 110 has four corners 508(1)-508(4). A platform support 506 is proximate to each corner 508 of the platform 110. Each corner 508 comprises a tab 512. The tab 512 comprises a portion of the platform 110 that is separated by a slit 510.

A lower piezoelectric transducer 118 is affixed to each tab 512. The slit 510 and tab 512 arrangement serves to accentuate the mechanical stress on the piezoelectric transducer mounted on the tab 512 to increase the signal produced by a change in mechanical load on the platform 110.

In this implementation, the long axis of the slits 510 are parallel to a long axis of the platform 110. In other implementations other arrangements may be used. In some implementations, instead of, or in addition to, the slits 510, other strain concentration features may be used. For example, the platform 110 may include one or more ridges. A piezoelectric transducer may be emplaced proximate to a portion of the platform 110 that exhibits significant mechanical deformation during changes in load due to weight.

A central region 514 is shown extending between the inner corners of the slits 510. During normal operation, the items 104 may be stowed within the central region 514. As described above, the platform 110 may be divided into various lanes. Each lane may stow a particular type of item 104. To facilitate the determination of one or more of the weight change data 138 or the weight change location data 140, a plurality of piezoelectric transducers may be arranged proximate to, or within (as shown), the central region 514.

In this illustration, the lower piezoelectric transducers 118 on the underside of the central region 514 are rectangular in shape, with their long axes parallel the expected lane arrangements of front-to-back to stow items 104. During operation, the signals from these piezoelectric transducers may be used to determine the weight change location data 140.

Other arrangements and other shapes of piezoelectric transducers may also be used. For example, the shape of the individual transducers may be rectangular, circular, and so forth. Other patterns of transducers with respect to the platform 110 may be used. In some implementations upper piezoelectric transducers 116 may also be used, mounted on the upper surface of the platform 110. For example, one or more upper piezoelectric transducers 116 may be used to compensate the output from the lower piezoelectric transducers 118.

A bottom view 520 of a folded implementation is also shown. In this implementation, a first portion of the platform 110 between the tabs 512 of the first corner 508(1) and the second corner 508(2) have been folded underneath the central region 514. A second portion of the platform 110 between the tabs 512 of the third corner 508(3) and the fourth corner 508(4) have also been folded underneath the central region 514. In this implementation the overall front-to-back distance of the apparatus 102 is reduced, allowing more efficient use of space in the facility. The folding may also increase the overall rigidity of the platform 110, improving performance, allowing for use of less material, and so forth. In implementations where the platform 110 comprises a metal, the first portion and the second portion may be bent underneath the central region 514 such that the plane of each portion is parallel to the plane of the central region 514.

Figure 6:
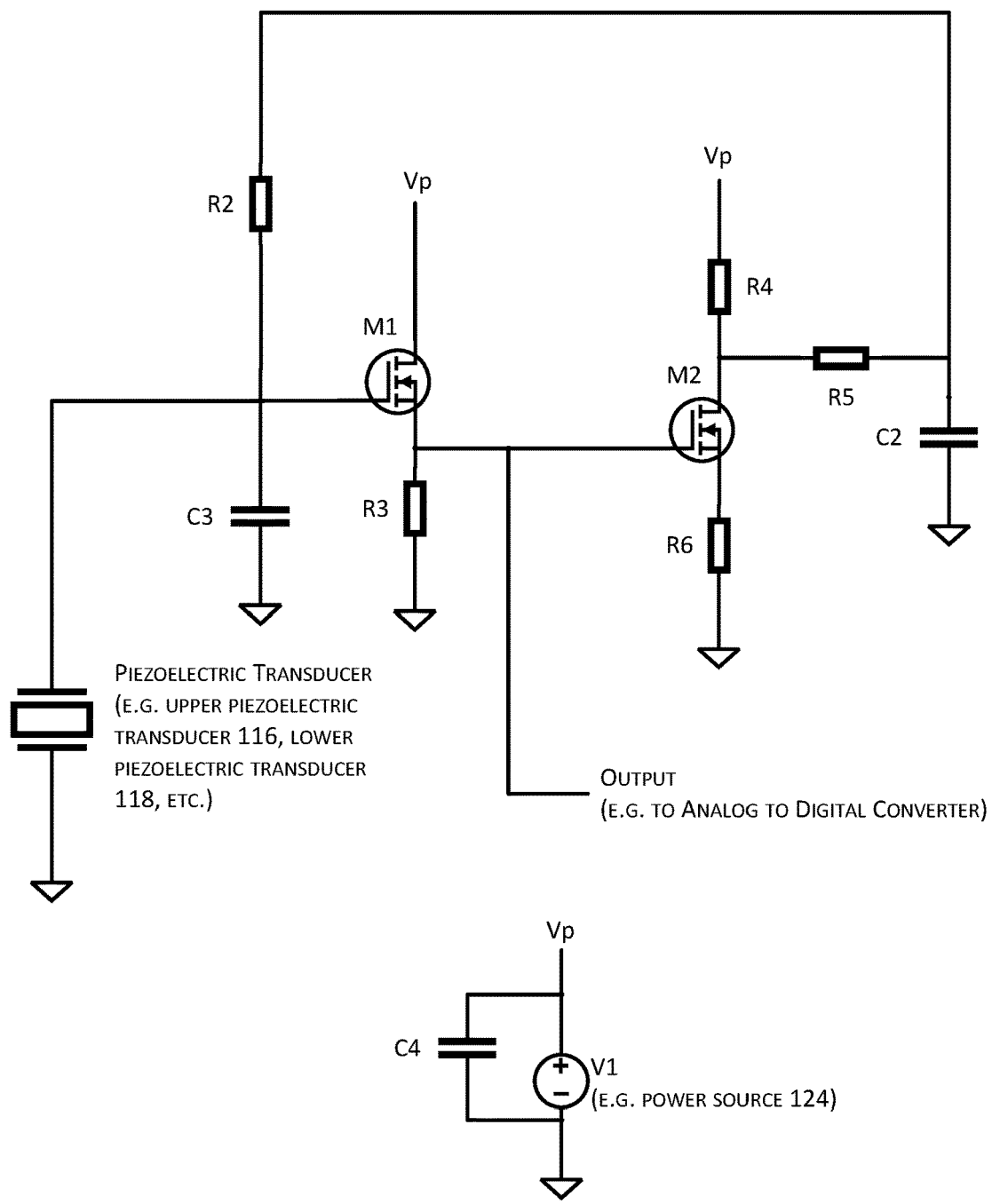
FIG. 6 illustrates a circuit diagram of an amplifier for use with a piezoelectric transducer, according to some implementations.

FIG. 6 illustrates a circuit diagram 600 of the amplifier 128 for use with a piezoelectric transducer, according to some implementations. Application of a mechanical stress on the piezoelectric material in the piezoelectric transducer produces a charge. This charge may manifest as a sudden impulse that decays over time. Charge measurement typically requires more sophisticated and expensive electronics. However, voltage is readily measured and quantized, such as by an ADC 130. The amplifier 128 may comprise circuitry that accepts as input the charge from the piezoelectric transducer and produces as output a voltage that is indicative of that charge.

In one implementation, a charge amplifier circuit using an operational amplifier (opamp) may be used to process the output from the piezoelectric transducer. In one implementation the opamp may consist of a MCP6044 from Microchip Technology, Inc. To prevent output from drifting due to noise and amplifier bias current, a large resistance may be added in parallel to the opamp. For example, a 1 gigaohm resistance may be connected between the negative terminal and the output of the opamp. This causes the output of the opamp to predictably tend toward the reference voltage applied to the positive terminal. A complementary metal oxide (CMOS) switch or other device may be added between an input terminal and output of the opamp to facilitate zeroing the output.

In some implementations, improved performance may be realized by using the amplifier circuit depicted in FIG. 6. The circuit avoids producing a step change at the output in response to the charge from the piezoelectric transducer. This output may still exhibit some decay, but may be more easily integrated to determine the weight change. The circuit may be implemented using semiconductor devices such as metal oxide semiconductor field effect transistors (FETs) or equivalent devices on a common die. The configuration of the FETs in the circuit allow the threshold voltages in each FET to track the other, cancelling out changes in threshold and preventing drift due to temperature effects. In one implementation the FETs may comprise N-channel enhancement mode devices, such as a TN0702 device from Supertex, Inc.

As shown here, a first piezoelectric transducer has a first piezoelectric terminal connected to a chassis ground. A second piezoelectric terminal of the first piezoelectric transducer is connected to a first node. As described herein, a node may comprise a common connection, junction point, or electrically connective structure. In some situations, for the purposes of modeling the circuitry or otherwise characterizing operation of the circuit, a first capacitor C1 and a first resistor R1 (not shown) may be inserted in series between the second piezoelectric terminal and the first node. For example, the circuit may be modeled with C1 having a value of 20 nanofarads and R1 having a value of 220 kiloohms.

A first terminal of a second resistor R2 is connected to the first node. In one implementation R2 may have a value of 500 megaohms.

A second terminal of the second resistor R2 is connected to a second node. A first terminal of a second capacitor C2 is connected to the second node. In one implementation C2 may have a value of 1 microfarad.

A second terminal of the second capacitor C2 is connected to the chassis ground. A first terminal of a third capacitor C3 is connected to the first node. In one implementation C3 may have a value of 220 nanofarads.

A second terminal of the third capacitor C3 is connected to the chassis ground.

A gate terminal of a first FET "M1" is connected to the first node. As described above, M1 may comprise an N channel enhancement mode field effect transistor device. A drain terminal of the first FET "M1" is connected to a positive terminal of a power source 124. For example, the power source 124 is represented in this diagram as a voltage source V1 having a negative terminal connected to the chassis ground. A positive terminal provides Vp. A fourth capacitor C4 is connected across the positive terminal and the negative terminal of V1.

A source terminal of the first FET "M1" is connected to a third node. A first terminal of a third resistor R3 is connected to the third node. In one implementation R3 may have a value of 1 megaohm. A second terminal of the third resistor R3 is connected to the chassis ground.

A gate terminal of a second FET "M2" is connected to the third node. As with M1, M2 is an N channel enhancement mode device. An output terminal for the amplifier 128 is connected to the third node. This output terminal may connect to an input line of the ADC 130.

A drain terminal of the second FET "M2" is connected to a fourth node. A first terminal of a fourth resistor R4 is connected to the fourth node. In one implementation R4 may have a value of 1 megaohm. A second terminal of the fourth resistor R4 is connected to the positive terminal Vp of the power source.

A first terminal of a fifth resistor R5 is connected to the fourth node. In one implementation R5 may have a value of 22 megaohms. A second terminal of the fifth resistor R5 is connected to the second node.

A source terminal of the second FET "M2" is connected to a first terminal of a sixth resistor R6. In one implementation R6 may have a value of 1 megaohm. A second terminal of the sixth resistor R6 is connected to the chassis ground. In other implementations other devices may be substituted, and different values for the various components may be used.

The implementations described above are provided for illustration, and not necessarily as limitations. For example, the apparatus 102 may include more than one platform 110.

In some implementations the apparatuses described herein may be used to retrofit existing devices. For example, existing devices that utilize strain-gauge based load cells may be replaced with the piezoelectric transducers and associated electronics 120.

The processes discussed herein may be implemented in hardware, software, or a combination thereof. In the context of software, the described operations represent computer-executable instructions stored on one or more non-transitory computer-readable storage media that, when executed by one or more processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage media may include, but is not limited to, hard drives, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case, and a variety of alternative implementations will be understood by those having ordinary skill in the art.

Additionally, those having ordinary skill in the art will readily recognize that the techniques and devices described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as illustrative forms of implementing the claims.

What is claimed is:

1. An apparatus comprising:
    a communication interface;
    a support structure;
    a platform comprising:
        an upper side,
        a lower side,
        a first tab at a first corner,
        a second tab at a second corner,
        a third tab at a third corner, and
        a fourth tab at a fourth corner;
    a first piezoelectric transducer affixed to an underside of the first tab;
    a second piezoelectric transducer affixed to an underside of the second tab;
    a third piezoelectric transducer affixed to an underside of the third tab;
    a fourth piezoelectric transducer affixed to an underside of the fourth tab; and
    electronic circuitry to:
        determine first data based on output from the first piezoelectric transducer;
        determine second data based on output from the second piezoelectric transducer;
        determine third data based on output from the third piezoelectric transducer;
        determine fourth data based on output from the first piezoelectric transducer;
        determine a weight change value based on the first data, the second data, the third data, and the fourth data;
        determine weight change location data based on the first data, the second data, the third data, and the fourth data, wherein the weight change location data is indicative of a location with respect to the platform where a weight change occurred; and
        send the weight change value and the weight change location data using the communication interface.

2. The apparatus of claim 1, further comprising:
    one or more piezoelectric transducers affixed to an underside of the platform within a central region; and
    wherein one or more of the weight change value or the weight change location data is based on output from the one or more piezoelectric transducers affixed to the underside of the platform.

3. The apparatus of claim 1, the electronic circuitry comprising:
    a first piezoelectric terminal of the first piezoelectric transducer connected to a chassis ground;
    a second piezoelectric terminal of the first piezoelectric transducer connected to a first node;
    a first terminal of a first resistor connected to the first node;
    a second terminal of the first resistor connected to a second node;
    a first terminal of a first capacitor connected to the second node;
    a second terminal of the first capacitor connected to the chassis ground;
    a first terminal of a second capacitor connected to the first node;
    a second terminal of the second capacitor connected to the chassis ground;
    a gate terminal of a first field effect transistor (FET) connected to the first node, wherein the first FET is an N channel enhancement mode device;
    a drain terminal of the first FET connected to a positive terminal of a power source;
    a source terminal of the first FET connected to a third node;
    a first terminal of a second resistor connected to the third node;
    a second terminal of the second resistor connected to the chassis ground;
    a gate terminal of a second FET connected to the third node, wherein the second FET is an N channel enhancement mode device;
    an output terminal connected to the third node;
    a drain terminal of the second FET connected to a fourth node;
    a first terminal of a third resistor connected to the fourth node;
    a second terminal of the third resistor connected to the positive terminal of the power source;
    a first terminal of a fourth resistor connected to the fourth node;
    a second terminal of the fourth resistor connected to the second node;
    a source terminal of the second FET connected to a first terminal of a fifth resistor; and
    a second terminal of the fifth resistor connected to the chassis ground.

4. An apparatus comprising:
    a communication interface;
    a first structure;
    a second structure;

a first piezoelectric transducer affixed to the second structure; and
electronic circuitry to:
determine first data based on output from the first piezoelectric transducer;
determine a weight change value based on the first data; and
send the weight change value using the communication interface.

5. The apparatus of claim 4, the electronic circuitry comprising:
a first piezoelectric terminal of the first piezoelectric transducer connected to a chassis ground;
a second piezoelectric terminal of the first piezoelectric transducer connected to a first node;
a first terminal of a first resistor connected to the first node;
a second terminal of the first resistor connected to a second node;
a first terminal of a first capacitor connected to the second node;
a second terminal of the first capacitor connected to the chassis ground;
a first terminal of a second capacitor connected to the first node;
a second terminal of the second capacitor connected to the chassis ground;
a gate terminal of a first field effect transistor (FET) connected to the first node, wherein the first FET is an N channel enhancement mode device;
a drain terminal of the first FET connected to a positive terminal of a power source;
a source terminal of the first FET connected to a third node;
a first terminal of a second resistor connected to the third node;
a second terminal of the second resistor connected to the chassis ground;
a gate terminal of a second FET connected to the third node, wherein the second FET is an N channel enhancement mode device;
an output terminal connected to the third node;
a drain terminal of the second FET connected to a fourth node;
a first terminal of a third resistor connected to the fourth node;
a second terminal of the third resistor connected to the positive terminal of the power source;
a first terminal of a fourth resistor connected to the fourth node;
a second terminal of the fourth resistor connected to the second node;
a source terminal of the second FET connected to a first terminal of a fifth resistor; and
a second terminal of the fifth resistor connected to the chassis ground.

6. The apparatus of claim 4, further comprising:
a third structure to support one or more items; and
wherein the third structure is attached to the second structure and a thermal insulator is between the second structure and the third structure.

7. The apparatus of claim 4, wherein the second structure comprises one or more of:
a platform, or
a crossbar comprising one or more mechanical engagement features to support one or more accessories.

8. The apparatus of claim 4, further comprising:
a third structure comprising one or more of:
a platform, or
a crossbar comprising one or more mechanical engagement features to support one or more accessories; and
wherein the third structure is attached to the second structure.

9. The apparatus of claim 4, wherein the second structure comprises a platform having an upper surface, and further comprising:
a thermal insulator covering a portion of the upper surface that is associated with stowing one or more items.

10. The apparatus of claim 4, wherein the second structure comprises a platform having a first tab and the first piezoelectric transducer is affixed to the first tab; and further comprising:
a platform support attached to an end of the first tab, wherein the platform support joins the first structure to the second structure.

11. The apparatus of claim 4, wherein the communication interface comprises a radio transmitter; and further comprising one or more of:
a photovoltaic cell to generate electrical power to operate the electronic circuitry, or
a non-rechargeable battery to supply electrical power to operate the electronic circuitry.

12. The apparatus of claim 4, the electronic circuitry to determine the weight change value by executing instructions to:
determine a first signal from the first piezoelectric transducer;
determine the first signal exceeds a threshold value at a first time;
determine a first interval that begins at a second time and ends at the first time;
determine a second interval that begins at the first time and ends at a third time;
determine a first fit of a first linear regression model to a portion of the first signal that is within the first interval;
determine a second fit of a second linear regression model to a portion of the first signal that is within the second interval; and
determine the first data based on a difference between the first fit and the second fit.

13. The apparatus of claim 4, further comprising:
a second piezoelectric transducer affixed to the second structure; and
the electronic circuitry further to:
determine second data based on output from the second piezoelectric transducer;
determine weight change location data based on the first data and the second data, wherein the weight change location data is indicative of a location with respect to the second structure where a weight change occurred; and
send the weight change location data using the communication interface.

14. An apparatus comprising:
a first piezoelectric transducer having a first piezoelectric terminal connected to a chassis ground;
a second piezoelectric terminal of the first piezoelectric transducer connected to a first node;
a first terminal of a first resistor connected to the first node;
a second terminal of the first resistor connected to a second node;

a first terminal of a first capacitor connected to the second node;

a second terminal of the first capacitor connected to the chassis ground;

a first terminal of a second capacitor connected to the first node;

a second terminal of the second capacitor connected to the chassis ground;

a gate terminal of a first field effect transistor (FET) connected to the first node, wherein the first FET is an N channel enhancement mode device;

a drain terminal of the first FET connected to a positive terminal of a power source;

a source terminal of the first FET connected to a third node;

a first terminal of a second resistor connected to the third node;

a second terminal of the second resistor connected to the chassis ground;

a gate terminal of a second FET connected to the third node, wherein the second FET is an N channel enhancement mode device;

an output terminal connected to the third node;

a drain terminal of the second FET connected to a fourth node;

a first terminal of a third resistor connected to the fourth node;

a second terminal of the third resistor connected to the positive terminal of the power source;

a first terminal of a fourth resistor connected to the fourth node;

a second terminal of the fourth resistor connected to the second node;

a source terminal of the second FET connected to a first terminal of a fifth resistor; and a second terminal of the fifth resistor connected to the chassis ground.

15. The apparatus of claim 14, further comprising:
a first structure;
a second structure;
a third structure having a first end and a second end; and
wherein:
the first piezoelectric transducer is affixed to the third structure;
a second piezoelectric transducer is affixed to the third structure;
the first end is attached to the first structure; and
the second end is attached to the second structure and a thermal insulator is between the second end and the second structure.

16. The apparatus of claim 14, further comprising:
a first structure having a first side and a second side that is opposite the first side, wherein the first piezoelectric transducer is affixed to the first side; and
a second piezoelectric transducer that is affixed to the second side.

17. The apparatus of claim 14, further comprising:
an analog to digital converter (ADC) having an input terminal connected to the output terminal;
an input line of a processor connected to an output of the ADC;
an output line of the processor connected to a wireless communication interface; and
the processor executing instructions to:
receive first data from the ADC;
determine a weight change value based on the first data; and
send the weight change value using the wireless communication interface.

18. The apparatus of claim 17, further comprising:
a first structure, wherein the first piezoelectric transducer is affixed to the first structure; and
further comprising a second piezoelectric transducer affixed to a second structure; and
electronic circuitry to:
determine second data based on output from the second piezoelectric transducer;
determine a weight change location based on the first data and the second data, wherein the weight change location is indicative of a location with respect to the first structure where a weight change occurred; and
send the weight change location using the wireless communication interface.

19. The apparatus of claim 14, further comprising:
a platform having a first tab, wherein the first piezoelectric transducer is affixed to the first tab; and further comprising:
a platform support attached to an end of the first tab, wherein the platform support joins the platform to a support structure.

20. The apparatus of claim 14, the power source comprising one or more of:
a photovoltaic cell, or
a non-rechargeable battery.

* * * * *

UNITED STATES PATENT AND TRADEMARK OFFICE
CERTIFICATE OF CORRECTION

| | |
|---|---|
| PATENT NO. | : 11,326,934 B1 |
| APPLICATION NO. | : 16/864763 |
| DATED | : May 10, 2022 |
| INVENTOR(S) | : Paul Eugene Munger et al. |

It is certified that error appears in the above-identified patent and that said Letters Patent is hereby corrected as shown below:

In the Claims

Column 15, Claim 15, Lines 66-67:
Currently read "determine fourth data based on output from the first piezoelectric transducer;" where they should read --determine fourth data based on output from the fourth piezoelectric transducer;--.

Signed and Sealed this
Eleventh Day of October, 2022

Katherine Kelly Vidal
*Director of the United States Patent and Trademark Office*